(12) United States Patent
Fessele et al.

(10) Patent No.: US 7,036,380 B2
(45) Date of Patent: May 2, 2006

(54) SENSOR DEVICE

(75) Inventors: Thomas Fessele, Stuttgart (DE); Masoud Habibi, Schwieberdingen (DE); Christian Roesser, Grossbottwar-Winzerhausen (DE); Markus Ledermann, Stuttgart (DE); Jan Gebauer, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/525,944

(22) PCT Filed: Jun. 18, 2004

(86) PCT No.: PCT/DE2004/001266

§ 371 (c)(1),
(2), (4) Date: Feb. 28, 2005

(87) PCT Pub. No.: WO2005/008205

PCT Pub. Date: Jan. 27, 2005

(65) Prior Publication Data

US 2005/0247133 A1    Nov. 10, 2005

(30) Foreign Application Priority Data

Jul. 15, 2003    (DE) .............................. 103 31 967

(51) Int. Cl.
*G01L 7/00*    (2006.01)
(52) U.S. Cl. ........................................... 73/706
(58) Field of Classification Search ........... 73/706, 73/753, 756; 29/25.01; 137/227, 240
See application file for complete search history.

(56) References Cited

U.S. PATENT DOCUMENTS

| 4,532,952 | A | * | 8/1985 | Norwood ................. 137/240 |
| 4,838,089 | A |   | 6/1989 | Okada et al. |
| 4,967,600 | A | * | 11/1990 | Keller ......................... 73/727 |
| 5,001,934 | A | * | 3/1991 | Tuckey ....................... 73/721 |
| 5,209,120 | A |   | 5/1993 | Araki |
| 5,461,922 | A | * | 10/1995 | Koen .......................... 73/756 |
| 6,521,966 | B1 |   | 2/2003 | Ishio et al. |

\* cited by examiner

*Primary Examiner*—William Oen
(74) *Attorney, Agent, or Firm*—Michael J. Striker

(57) ABSTRACT

A sensor, in particular a pressure sensor, having a housing 1; a housing interior 12 that contains a sensor element 9; electrical connecting elements 7 that are routed from the outside, through a housing part 2, and into the housing interior 19 and have connecting segments 17, which protrude into the housing interior on an inside 14 of the housing part 2 at respective entry points 15 and are electrically connected to the sensor element; and having a protective covering 21 that covers the connecting segments and the sensor element. To prevent air bubbles from getting into the protective covering, a sealing material 20 is applied onto the connecting segments 17, at least in the region of the entry point 15 of the respective connecting segments 17 into the housing interior 19 and the part 13 of the inside 14 of the housing part 2 encompassing the entry point 15, and the covering 21 is applied onto the sealing material 20 and the connecting segments 17.

10 Claims, 1 Drawing Sheet

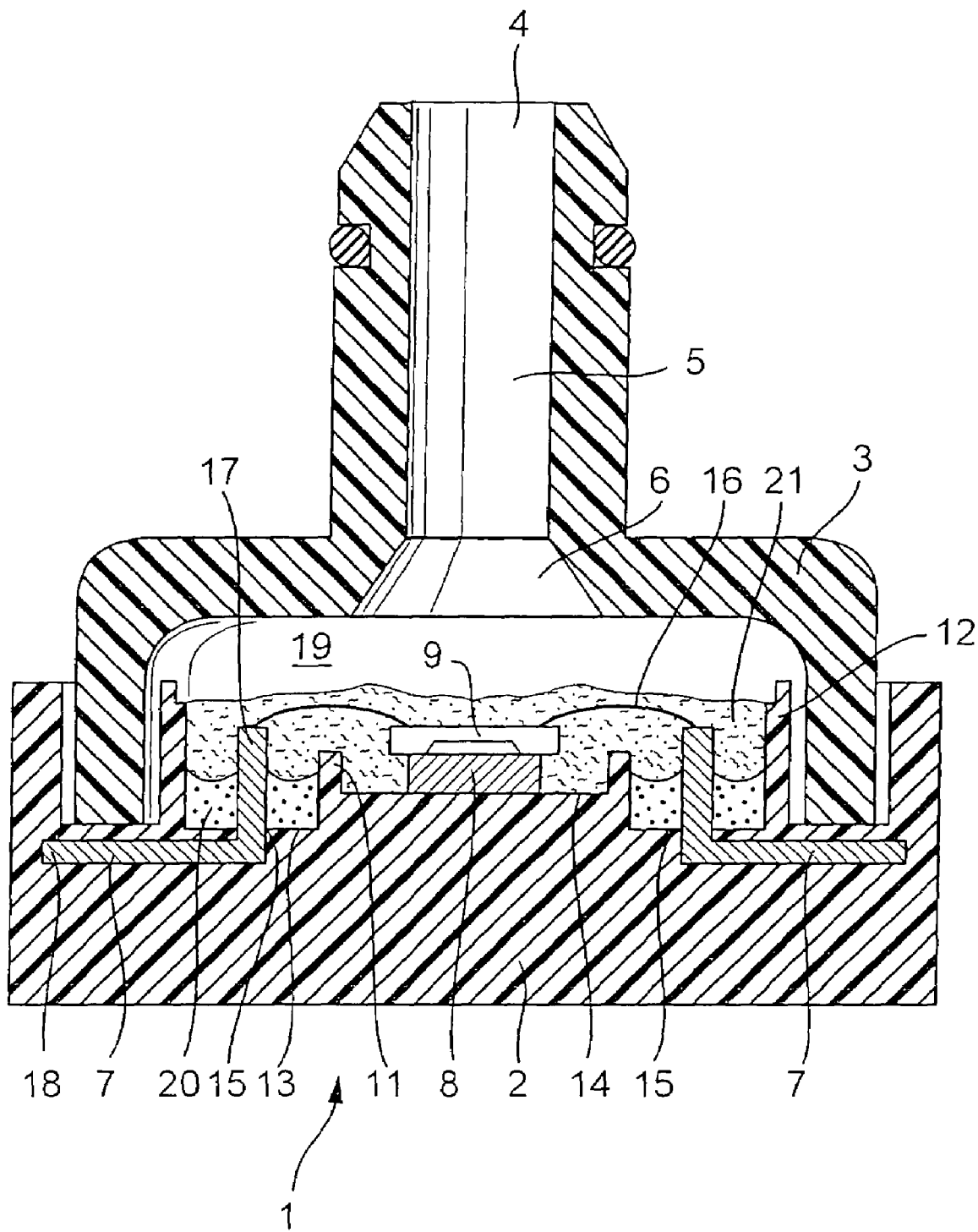

SENSOR DEVICE

PRIOR ART

The invention relates to a sensor, in particular a pressure sensor, with the characteristics of the preamble to the independent claim 1.

A sensor of this kind is known, for example, from U.S. Pat. No. 6,521,966 B1. By contrast with known sensors of a previous type, in which the sensor element was mounted onto a printed circuit board or hybrid and the connecting elements of the sensor were brought into contact with the printed circuit board or hybrid, in the sensors disclosed by U.S. Pat. No. 6,521,966 B1, the sensor element, which can also accommodate a chip with an integrated evaluation circuit, is inserted into a housing of the sensor without the use of a printed circuit board or a hybrid. To this end, the sensor element can be glued, for example indirectly or directly, by means of an adhesive to the inside of a housing part, which is for example an injection-molded part made of plastic, and then, by means of bonding wires, brought into electrical contact with connecting segments of the connecting elements that protrude into the interior of the housing. It is also possible to solder decoupling capacitors (EMC capacitors) or similar components to the connecting segments or to glue them to these segments by means of a conductive adhesive and then to attach them to the sensor element by means of bonding wire. To protect it from mechanical stress or exposure to chemicals, the sensor element equipped with the integrated evaluation circuit is provided with a protective covering comprised of gel that also covers the bonding wires and the point at which the connecting elements exit from the plastic of the housing.

ADVANTAGES OF THE INVENTION

During application of the gel, care must be taken that no inclusions of air get into the gel and also that no air bubbles form over the life of the sensor. During the application of the gel onto the sensor element and connecting segments, even if care is taken that no air inclusions are initially present in the protective covering, in the sensors known from the prior art, it is not possible to prevent air from the region between the connecting elements and the housing part—which air was either encapsulated there from the beginning as a result of the injection-molding process or penetrated into this region from the outside along the connecting elements only after the manufacture of the sensor—from getting into the gel protective covering at the entry point of the connecting segments into the housing interior. Particularly with pressure sensors, the air inclusions that get into the protective covering can expand explosively or can shoot rapidly through the gel, thus causing damage to the bonding wires. This renders the sensor unusable.

The sensor according to the present invention advantageously prevents air, which has penetrated into the region between the connecting elements and the plastic of the housing part or was already contained there as a result of manufacturing, from being able to penetrate into the gel protective covering. This is advantageously achieved by means of a sealing material that is applied in the region of the entry point of the respective connecting segments into the housing interior and the part of the interior of the housing part surrounding the entry point. The sealing material seals the entry point of the respective connecting segments on the inside of the housing so that no air can get into the protective covering.

Advantageous embodiments and modifications of the present invention are possible by means of the steps taken in the dependent claims.

In a particularly simple manner, a sealing adhesive can be used as the sealing material and is applied onto the inside of the housing part equipped with the sensor element, in the region of the entry point of the respective connecting elements into the housing interior.

The sealing material can, in particular, be a hardenable sealing material.

In an advantageous manner, the inside of the housing part is provided with a recess for the sealing material that encompasses the entry point of the respective connecting segments so that a dispensing unit can apply the sealing material, which then remains in the recess.

DRAWING

An exemplary embodiment of the present invention is shown in the drawing and will be explained in the description below. The sole FIGURE shows a cross section through a sensor according to the present invention, which is embodied in the form of a pressure sensor in the example shown.

DESCRIPTION OF AN EXEMPLARY EMBODIMENT

The sole FIGURE shows a cross section through a sensor, which is a pressure sensor in the example shown. The sensor has a housing 1, which encloses a housing interior 19. The housing 1 is comprised of two parts: a first housing part 2 and a second housing part 3 that can be placed onto the first housing part 2. The second housing part 3 has a pressure connection 4 with a pressure conduit 5 that feeds into the housing interior 19. The first housing part 2 can be attached to the second housing part 3 by gluing, detent connection, welding, or other suitable means. Both housing parts 2, 3 are made of plastic in the exemplary embodiment shown here. The first housing part 2 has connecting elements 7 that are incorporated into the first housing part 2 in the form of insert parts. This can be accomplished, for example, by means of an injection-molding process. The connecting elements 7 are routed from outside, through the housing part 2, and into the housing interior 19 and have connecting segments 17 that protrude into the housing interior 19, each at its own entry point 15, on the inside 14 of the first housing part 2. The outer ends 18 of the connecting elements 7 oriented away from the connecting segments 17 are routed out of the housing part 2 at the rear (not shown in the figure) and are used to produce contact between the sensor and external units.

The part 13 of the interior 14 encompassing the entry point 15 of the respective connecting segments 17 constitutes a recess that is delimited on the side oriented away from the sensor element by an outer wall 12 and on the side oriented toward the sensor element by an inner wall 11. Between the inner wall 11 and the outer wall 12, a sealing material 20 is applied onto the part 13 of the inside of the housing part 2 so that the sealing material in the region of the entry point 15 covers the outer wall of the connecting segments 17 and the part 13 of the inside encompassing it. The sealing material 20 can advantageously be comprised of a hardenable sealing material, for example a hardenable sealing adhesive that hermetically seals the entry point 15.

When in the unhardened state, the sealing adhesive should be as highly fluid as possible in order to be able to favorably penetrate into the capillaries. When in the hardened state, the sealing adhesive should be thermally stable, still ductile, and not brittle in order not to fracture when exposed to alternating temperatures. For example, a one or two-component epoxy resin adhesive could be used as the sealing adhesive. However, it is also possible to use a polyurethane glue, an acrylate glue, or another suitable adhesive.

The ends of the connecting segments 17 protruding into the interior 19 project partway out of the sealing material 20 and are connected to the sensor element 9 by means of bonding wires 16. The sensor element 9 is a pressure sensor chip that is mounted on a glass base 8, which is in turn glued, for example, to the inside 14 of the housing part 2. A protective covering 21 comprised of a gel, for example a silicone gel, is applied onto the inside 14 of the housing 2, inside the region delimited by the outer wall 12. The gel completely covers the bonding wires 16, the inner wall 11, the sensor element 9, and the ends of the connecting segments 17 protruding from the sealing material.

It is clear that the sealing material 20 keeps out air inclusions, which, without some sort of preventive measure, could get into the housing interior 19 and protective covering 21 at the entry points 15 of the connecting elements 17. This advantageously prevents damage to the bonding wires 16.

What is claimed is:

1. A sensor, in particular a pressure sensor, having a housing (1); a housing interior (12) that contains a sensor element (9); electrical connecting elements (7) that are routed from the outside, through a housing part (2), and into the housing interior (19) and have connecting segments (17), which protrude into the housing interior on an inside (14) of the housing part (2) at respective entry points (15) and are electrically connected directly or indirectly to the sensor element; and having a protective covering (21) that covers the connecting segments and the sensor element,
wherein a sealing material (20) is applied onto the connecting segments (17), at least in the region of the entry point (15) of the connecting segments (17) into the housing interior (19) and the part (13) of the inside (14) of the housing part (2) encompassing the entry point (15), and the covering (21) is applied onto the sealing material (20) and the connecting segments (17).

2. The sensor as recited in claim 1,
wherein the sealing material (20) is a hardenable sealing material.

3. The sensor as recited in claim 1,
wherein the sealing material (20) is a sealing adhesive.

4. The sensor as recited in claim 1,
wherein the protective covering (21) is manufactured out of a gel, in particular a silicone gel.

5. The sensor as recited in claim 1,
wherein the part (13) of the inside (14) of the housing part (2) encompassing the connecting segments (7) constitutes a recess for the sealing material, which recess has an inner wall (11) on the side oriented toward the sensor element (9) and an outer wall (12) on the side oriented away from it.

6. The sensor as recited in claim 5,
wherein the outer wall (12) simultaneously constitutes a frame that laterally delimits the protective covering (21).

7. The sensor as recited in claim 1, wherein the connecting segments (17) are electrically connected to the sensor element (9) by means of bonding wires.

8. The sensor as recited in claim 1, wherein the protective covering (21) completely covers the sealing material (20).

9. The sensor as recited in claim 8,
wherein the protective covering (21) completely covers the ends of the connecting segments (17) protruding from the sealing material (20).

10. A method for manufacturing a sensor as recited in claim 1,
wherein in a first step, a sealing material (20) is applied onto the connecting segments (17), at least in the region of the entry point (15) of the respective connecting segments (17) into the housing interior and the part (13) of the inside (14) of the housing part (2) encompassing the entry point (15), and then in a second step, the protective covering (21) is applied onto the sealing material (20) and the connecting segments (17).

* * * * *